(12) United States Patent
Nobori

(10) Patent No.: US 9,042,108 B2
(45) Date of Patent: May 26, 2015

(54) DISPLAY DEVICE

(75) Inventor: Kazuhiro Nobori, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 112 days.

(21) Appl. No.: 13/702,216

(22) PCT Filed: Apr. 11, 2011

(86) PCT No.: PCT/JP2011/002112
§ 371 (c)(1),
(2), (4) Date: Dec. 5, 2012

(87) PCT Pub. No.: WO2011/161857
PCT Pub. Date: Dec. 29, 2011

(65) Prior Publication Data
US 2013/0141881 A1 Jun. 6, 2013

(30) Foreign Application Priority Data
Jun. 22, 2010 (JP) .................................. 2010-141125

(51) Int. Cl.
| H05K 1/00 | (2006.01) |
| H05K 7/00 | (2006.01) |
| G02F 1/1345 | (2006.01) |
| H05K 1/14 | (2006.01) |
| H05K 3/36 | (2006.01) |
| H05K 13/00 | (2006.01) |
| H05K 3/32 | (2006.01) |

(52) U.S. Cl.
CPC ............. *H05K 7/00* (2013.01); *G02F 1/13452* (2013.01); *H05K 1/147* (2013.01); *H05K 3/323* (2013.01); *H05K 3/361* (2013.01); *H05K 2201/055* (2013.01); *H05K 13/00* (2013.01); *H01L 2924/0002* (2013.01); *H05K 2201/045* (2013.01); *H05K 2201/09445* (2013.01)

(58) Field of Classification Search
CPC ............... G02F 1/13452; H05K 1/147; H05K 2201/055
USPC .......... 361/749, 748, 807, 760; 174/250–261; 29/829, 835
See application file for complete search history.

(56) References Cited

U.S. PATENT DOCUMENTS

| 4,431,270 | A | 2/1984 | Funada et al. | |
| 7,246,431 | B2 * | 7/2007 | Bang et al. ...................... | 29/835 |
| 7,342,810 | B2 | 3/2008 | Tsubokura et al. | |
| 8,144,473 | B2 * | 3/2012 | Yumoto et al. ................ | 361/749 |

(Continued)

FOREIGN PATENT DOCUMENTS

| CN | 100414403 C | 8/2008 |
| JP | 56-121018 | 9/1981 |

(Continued)

*Primary Examiner* — Yuriy Semenenko
(74) *Attorney, Agent, or Firm* — Hamre, Schumann, Mueller & Larson, P.C.

(57) ABSTRACT

In a display device (100), a row of protruding electrodes (115) and a row of protruding electrodes (116) are formed on the connecting surface of a terminal section (112), the row of the protruding electrodes (116) is disposed between the row of the protruding electrodes (115) and a display section (111), one end of a flexible printed board (150) is connected to the row of the protruding electrodes (115), one end of a flexible printed board (160) is connected to the row of the protruding electrodes (116), the row of the protruding electrodes (115) is adjacent to the row of the protruding electrodes (116), and the one end of the flexible printed board (150) and the one end of the flexible printed board (160) are opposed to each other.

8 Claims, 10 Drawing Sheets

(56) References Cited

U.S. PATENT DOCUMENTS

| | | | |
|---|---|---|---|
| 2004/0000708 A1* | 1/2004 | Rapport et al. | 257/686 |
| 2004/0217471 A1* | 11/2004 | Haba | 257/734 |

FOREIGN PATENT DOCUMENTS

| | | | |
|---|---|---|---|
| JP | 5-40272 | | 2/1993 |
| JP | 5-196953 | | 8/1993 |
| JP | H10-39775 | | 2/1998 |
| JP | 2000-155306 | | 6/2000 |
| JP | 2000-242194 | | 9/2000 |
| JP | 2000242194 | * | 9/2000 |
| JP | 2002-151822 | | 5/2002 |
| KR | 10-2008-0022442 | | 3/2008 |

* cited by examiner

DISPLAY DEVICE

TECHNICAL FIELD

The present invention relates to display devices such as a liquid crystal display device and an organic EL display device which can provide high-quality display with a smaller thickness and lower power consumption.

BACKGROUND ART

In recent years, display devices such as a liquid crystal display device and an organic EL display device have been developed which can provide high-quality display with a smaller thickness and lower power consumption. These display devices each include a display section that displays an image and a terminal section formed around the display section. The terminal section includes a plurality of protruding electrodes that are electrically connected to control lines for controlling the pixel portions of the display section. As the display section has higher resolution and smaller size, a pitch between the protruding electrodes disadvantageously decreases.

Moreover, variations in the amount of an applied organic EL material and degradation of the organic EL material cause an organic EL display device to emit light in varying amounts, leading to variations in luminance over the display section. In order to eliminate variations in luminance, feedback processing on a voltage and a current is necessary, resulting in a complicated driving circuit for driving a pixel portion of the display section. Thus, the number of control lines for controlling the pixel portions of a display section tends to increase as compared with a liquid crystal display device. Accordingly, a pitch between the protruding electrodes disadvantageously decreases.

To address this problem, a method of increasing a pitch between protruding electrodes by a staggered arrangement has been proposed (for example, see Patent Literature 1).

Specifically, as illustrated in FIG. 14A, a display device 10 includes a plurality of external circuits 30 around an insulating substrate 40. Flexible printed boards 50 are stacked on the insulating substrate 40. Flexible printed boards 60 are stacked over the respective flexible printed boards 50. The external circuits 30 are electrically connected to the insulating substrate 40 via the flexible printed boards 50 and 60.

As illustrated in FIG. 14B, the insulating substrate 40 includes a large number of electrodes 43 arranged at a predetermined pitch. The insulating substrate 40 further includes insulating films 41 and insulating films 42 that are alternately formed along the alignment direction of the electrodes 43 so as to partially cover the electrodes 43.

As illustrated in FIG. 14C, the flexible printed board 50 includes a large number of electrodes 51 formed at a pitch twice as large as the predetermined pitch. The flexible printed board 60 includes a large number of electrodes 61 formed at a pitch twice as large as the predetermined pitch. The electrodes 43 exposed outside the insulating films 42 are connected to the electrodes 51. The electrodes 43 exposed inside the insulating films 41 are connected to the electrodes 61.

CITATION LIST

Patent Literature

Patent Literature 1: Japanese Patent Laid-Open No. 5-196953

SUMMARY OF INVENTION

Technical Problem

In the conventional display device 10, however, sets of the flexible printed boards 50 and 60 are mounted on the staggered electrodes 43. At this point, one ends of the flexible printed boards 50 are located on the insulating substrate 40 while the other ends of the flexible printed boards 50 are located on the external circuits 30. One ends of the flexible printed boards 60 are located on the insulating substrate 40 while the other ends of the flexible printed boards 60 are located on the external circuits 30. Hence, the step of mounting the flexible printed boards 50 (for example, see FIG. 15) and the step of mounting the flexible printed boards 60 (for example, see FIG. 16) are separately performed. Accordingly, a production lead time increases.

As illustrated in FIG. 15, when the flexible printed board 50 is mounted using an anisotropic conductive film (hereinafter will be called an ACF) 53, the ACF 53 spreads like a flow. Thus, as illustrated in FIG. 16, when the flexible printed board 60 is mounted, the electrodes 43 need to be spaced at intervals of about 1 mm to 2 mm in order to prevent physical interference with the spread ACF 53. The region of a frame-like terminal section is extended so as to increase in frame width. Unfortunately, the ACF 53 may prevent a reduction in frame width.

In view of the problems, an object of the present invention is to provide a display device that can prevent an increase in production lead time and an increase in the frame width of a terminal section even if the number of mounted flexible printed boards increases.

Solution to Problem

In order to attain the object, a display device according to the present invention has the following features:

The display device according to the present invention is (a) a display device including a display section that displays an image and a terminal section that is formed around the display section, wherein (b) the display device includes a first flexible printed board and a second flexible printed board overlapping the first flexible printed board, (c) a row of first protruding electrodes and a row of second protruding electrodes are formed on the connecting surface of the terminal section, (d) the row of the second protruding electrodes is disposed between the row of the first protruding electrodes and the display section, (e) one end of the first flexible printed board is connected to the row of the first protruding electrodes, (f) one end of the second flexible printed board is connected to the row of the second protruding electrodes, (g) the row of the first protruding electrodes is adjacent to the row of the second protruding electrodes, and (h) the one end of the first flexible printed board and the one end of the second flexible printed board are opposed to each other.

The present invention may be implemented as a method of manufacturing a display device, in addition to the display device.

The method of manufacturing the display device according to the present invention is (a) a method of manufacturing a display device including a display section that displays an image and a terminal section that is formed around the display section, wherein (b) a row of first protruding electrodes and a row of second protruding electrodes are formed on the connecting surface of the terminal section, the row of the second protruding electrodes is disposed between the row of the first protruding electrodes and the display section, and the row of the first protruding electrodes is adjacent to the row of the second protruding electrodes, the method including: (c) disposing one end of a first flexible printed board above the row of the first protruding electrodes and disposing one end of a second flexible printed board above the row of the second protruding electrodes in a state in which the one end of the first flexible printed board and the one end of the second flexible printed board are opposed to each other, and (d) simultaneously pressing the one end of the first flexible printed board and the one end of the second flexible printed board by a head to connect the one end of the first flexible printed board to the row of the first protruding electrodes and the one end of the second flexible printed board to the row of the second protruding electrodes.

Advantageous Effects of Invention

According to the present invention, the one end of the first flexible printed board and the one end of the second flexible printed board are opposed to each other. Thus, the first flexible printed board and the second flexible printed board can be connected to the connecting surface of the terminal section in a single connecting step. Accordingly, even if the number of mounted flexible printed boards increases, an increase in production lead time can be avoided.

The first protruding electrodes (the row of the first protruding electrodes) are adjacent to the second protruding electrodes (the row of the second protruding electrodes). Thus, even if the number of mounted flexible printed boards increases, an increase in the frame width of the terminal section can be avoided.

DESCRIPTION OF EMBODIMENT (Embodiment)

An embodiment according to the present invention will be described below with reference to the accompanying drawings.

<Configuration>

Figure 1:
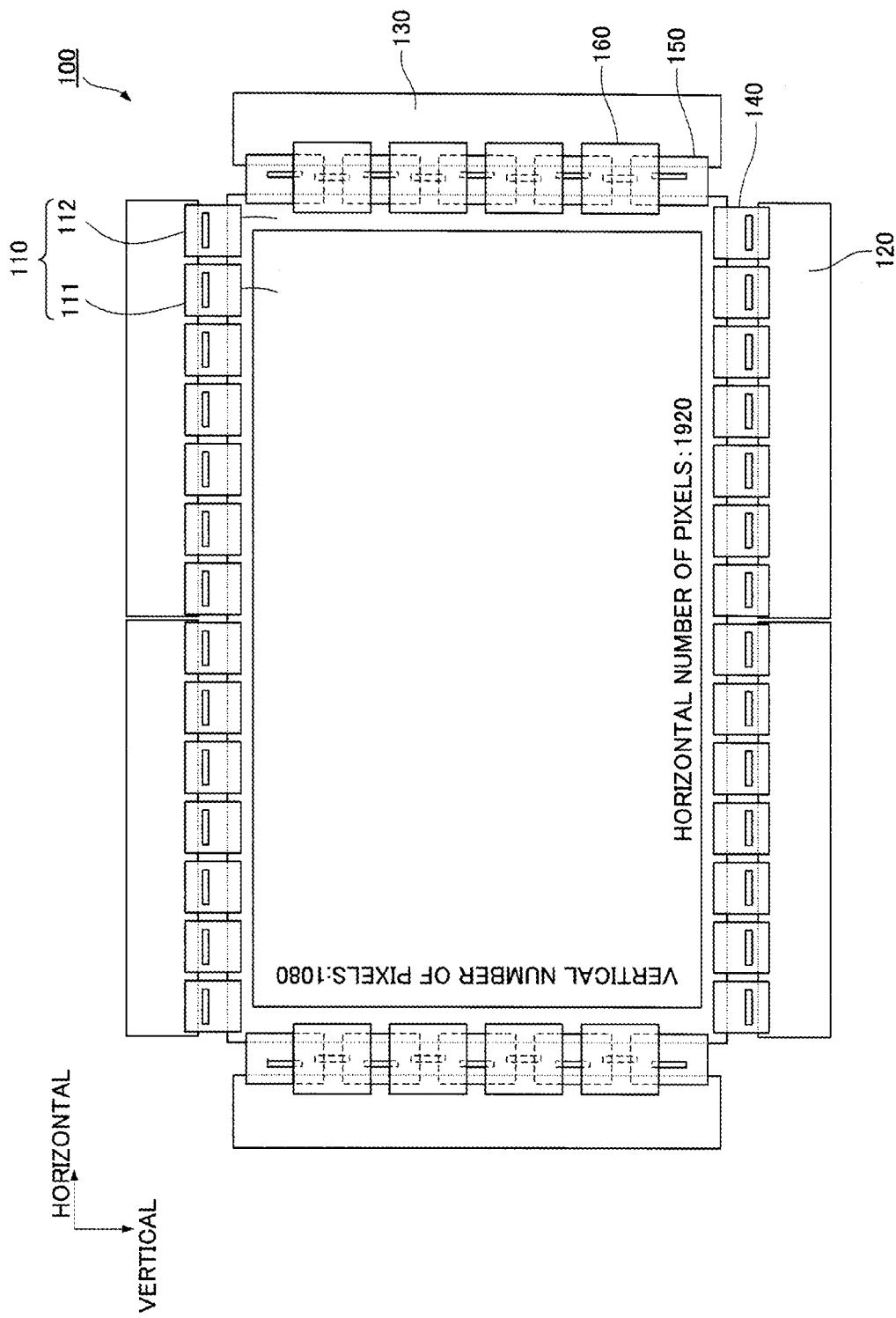
FIG. 1 illustrates the overall configuration of a display device according to an embodiment.

As illustrated in FIG. 1, in a display device 100 according to the present embodiment, external circuits 120 and 130 are disposed around a panel 110. The panel 110 includes a display section 111 that displays an image and a terminal section 112 formed around the display section 111. The external circuits 120 and 130 are glass epoxy multilayer boards that supply power, signals, and so on to the panel 110 to display images on the panel 110.

In this example, in the display device 100, the two external circuits 120 are disposed next to a horizontal part of the terminal section 112 on each of the upper and lower ends of the panel 110 with respect to the vertical direction. The external circuit 130 is disposed next to a vertical part of the terminal section 112 on each of the right and left ends of the panel 110 with respect to the horizontal direction. The longitudinal direction of the external circuit 120 is aligned with the horizontal direction. The longitudinal direction of the external circuit 130 is aligned with the vertical direction. The longitudinal dimension of the external circuit 120 is substantially equal to a half of the horizontal dimension of the horizontal part of the terminal section 112. The longitudinal dimension of the external circuit 130 is substantially equal to the vertical dimension of the vertical part of the terminal section 112.

Figure 2:
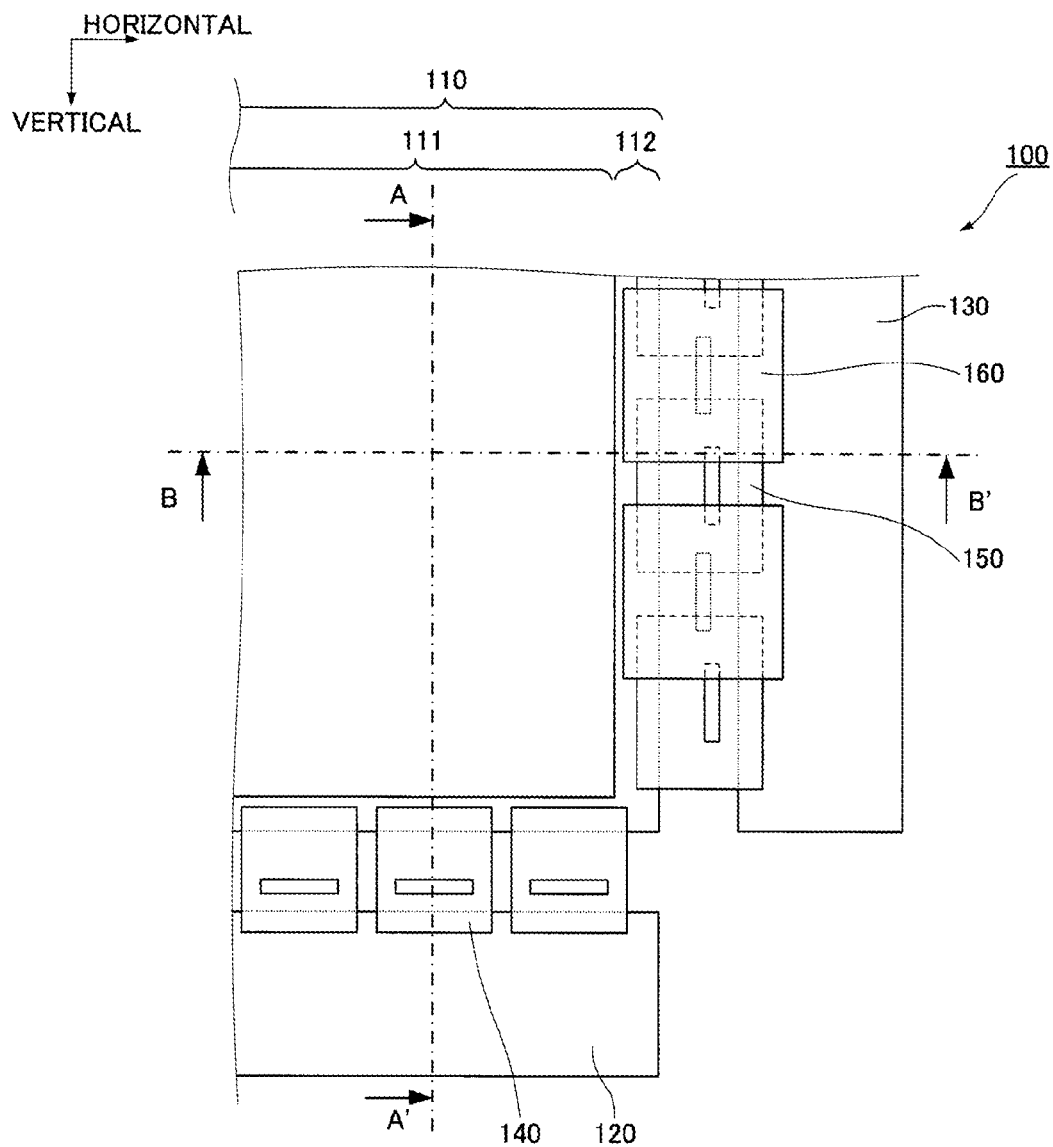
FIG. 2 illustrates the lower right part of the display device according to the embodiment.

Moreover, in the display device 100, a plurality of flexible printed boards 140 are mounted in a horizontal row on the horizontal part of the terminal section 112. A plurality of flexible printed boards 150 are mounted in a vertical row on the vertical part of the terminal section 112. Furthermore, a plurality of flexible printed boards 160 are mounted in a vertical row so as to overlap the flexible printed boards 150. As shown in FIG. 2, the external circuit 120 is electrically connected to the horizontal part of the terminal section 112 via the flexible printed boards 140. The external circuit 130 is electrically connected to the vertical part of the terminal section 112 via the flexible printed boards 150 and 160.

Figure 3:
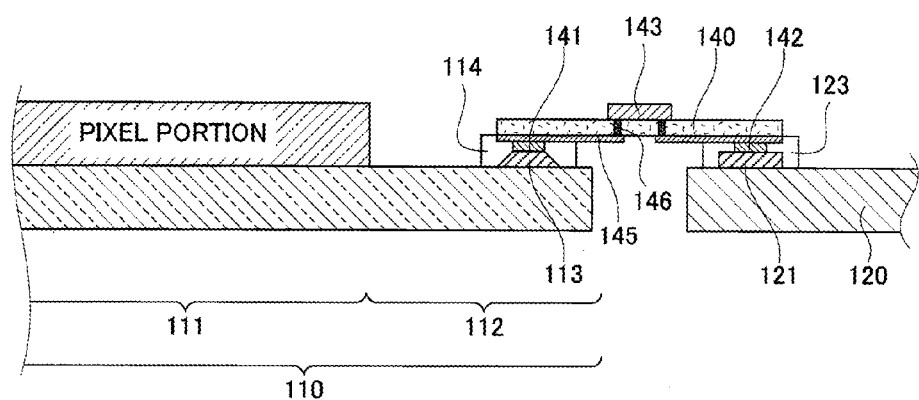
FIG. 3 is a cross-sectional view of the lower right part of the display device taken along the arrows A-A' according to the embodiment.
Figure 4:
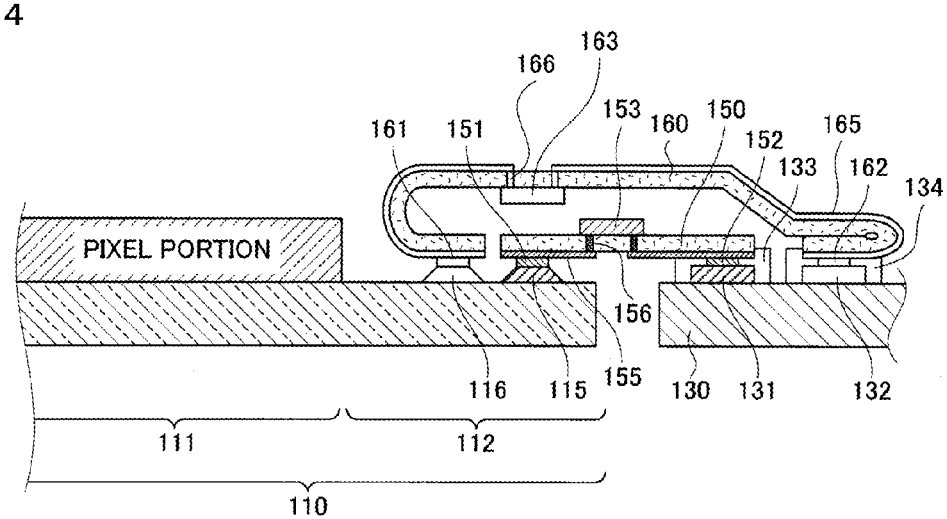
FIG. 4 is a cross-sectional view of the lower right part of the display device taken along the arrows B-B' according to the embodiment.
Figure 5:
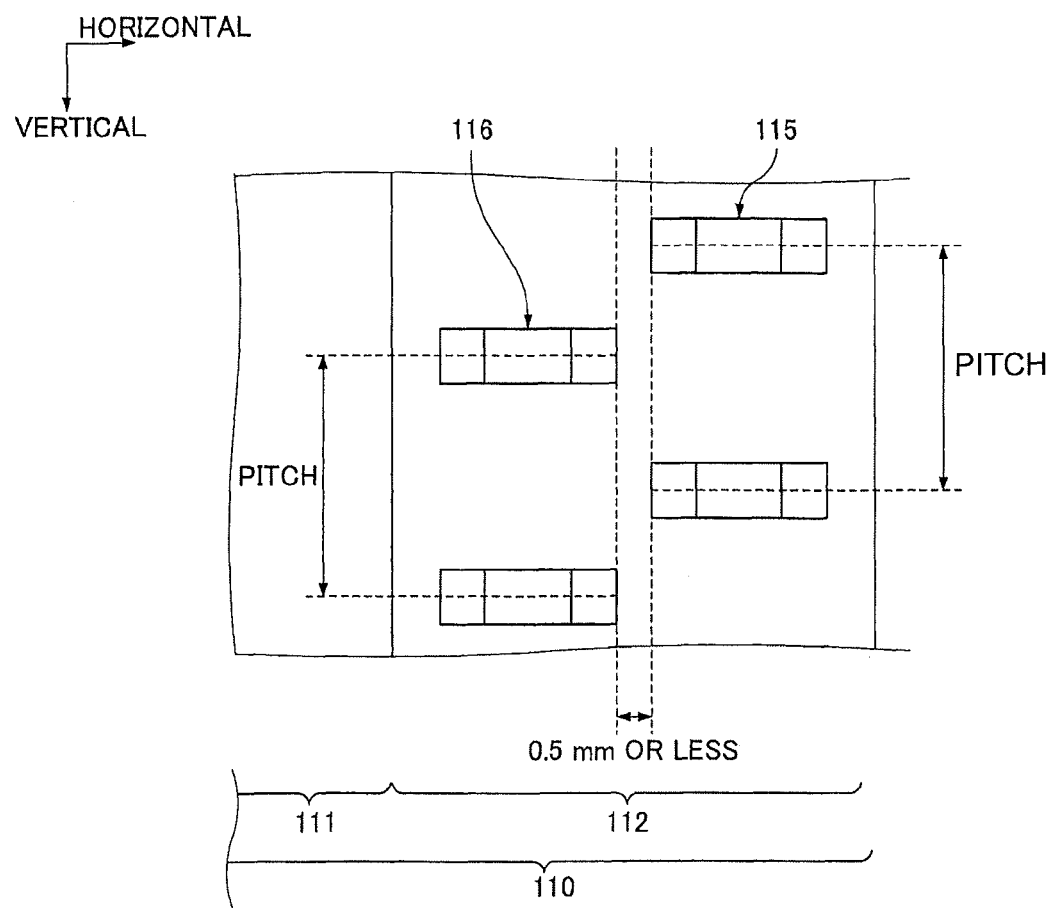
FIG. 5 illustrates a terminal section in the display device according to the embodiment.

In the display device 100, as illustrated in FIG. 3, a plurality of protruding electrodes 113 are formed in a horizontal row on the horizontal part (connecting surface) of the terminal section 112. As illustrated in FIG. 4, a plurality of protruding electrodes 115 are formed in a vertical row on the vertical part (connecting surface) of the terminal section 112. Furthermore, a plurality of protruding electrodes 116 are formed in a vertical row on the vertical part (connecting surface) of the terminal section 112. The row of the protruding electrodes 115 is adjacent to the row of the protruding electrodes 116. The row of the protruding electrodes 116 is disposed between the row of the protruding electrodes 115 and the display section 111. As illustrated in FIG. 5, the protruding electrodes 115 and 116 are staggered to increase a pitch between the protruding electrodes in the vertical part of the terminal section 112. Spacing between the row of the protruding electrodes 115 and the row of the protruding electrodes 116 is 0.5 mm or less.

In the display device 100, as illustrated in FIG. 3, a plurality of metal electrodes 121 are formed in a horizontal row on the external circuit 120 (connecting surface). As illustrated in FIG. 4, a plurality of metal electrodes 131 are formed in a vertical row on the external circuit 130 (connecting surface). Furthermore, a plurality of metal electrodes 132 are formed in a vertical row next to the metal electrodes 131. The row of the metal electrodes 132 is located farther from the terminal section 112 than the row of the metal electrodes 131.

The display device 100 further includes, as illustrated in FIG. 3, wires 145 formed only on one surface of the flexible printed board 140. A plurality of output-side electrodes 141 and a plurality of input-side electrodes 142 are formed on the surface that bears the wires 145. A semiconductor element 143 is mounted on the opposite side from the wires 145. The wires 145 are connected to bumps 146 by metallic joints of gold and tin or metallic joints of gold. The output-side electrodes 141 are electrically connected to the output-side terminals of the semiconductor element 143 via the wires 145 and the bumps 146. The input-side electrodes 142 are electrically connected to the input-side terminals of the semiconductor element 143 via the wires 145 and the bumps 146. As shown in FIG. 4, the flexible printed boards 150 and 160 are identical in structure to the flexible printed board 140 and thus the explanation thereof is omitted.

In the display device 100, the surfaces of the protruding electrodes 113, 115, and 116 are made of metals such as Al, Au, and Cu. The surfaces of the metal electrodes 121, 131, and 132 are plated with gold to prevent oxidation. The surfaces of the output-side electrodes 141 and output-side electrodes 151 and 161 are made of metals such as Au, Sn, Ag, Al, and Cu. The surfaces of the input-side electrodes 142 and input-side electrodes 152 and 162 are made of metals such as Au, Sn, Ag, Al, and Cu.

In the display device 100, as illustrated in FIG. 3, the output-side electrodes 141 are disposed on one end (output-side connected portion) of the flexible printed board 140 while the input-side electrodes 142 are disposed on the other end (input-side connected portion) of the flexible printed board 140. The output-side electrodes 141 are connected to the protruding electrodes 113 covered with an ACF 114. The input-side electrodes 142 are connected to the metal electrodes 121 covered with an ACF 123.

In the display device 100, as illustrated in FIG. 4, the output-side electrodes 151 are disposed on one end (output-side connected portion) of the flexible printed board 150 while the input-side electrodes 152 are disposed on the other end (input-side connected portion) of the flexible printed board 150. The output-side electrode 151 is connected to the protruding electrode 115 in a state in which an alloy layer is formed on a contact portion between the protruding electrode 115 and the output-side electrode 151. The input-side electrodes 152 are connected to the metal electrodes 131 covered with an ACF 133.

In the display device 100, the output-side electrodes 161 are disposed on one end (output-side connected portion) of the flexible printed board 160 while the input-side electrodes 162 are disposed on the other end (input-side connected portion) of the flexible printed board 160. The output-side electrode 161 is connected to the protruding electrode 116 in a state in which an alloy layer is formed on a contact portion between the protruding electrode 116 and the output-side electrode 161. The input-side electrodes 162 are connected to the metal electrodes 132 covered with an ACF 134.

In the display device 100, the one end (output-side connected portion) of the flexible printed board 150 and the one end (output-side connected portion) of the flexible printed board 160 are opposed to each other. The flexible printed board 160 is folded an even number of times between the one end (output-side connected portion) and the other end (input-side connected portion) of the flexible printed board 160. The flexible printed board 160 is folded to the external circuit 130 above the terminal section 112 so as not to block light at least to the display section 111.

In the display device 100, a control line drawn from each of the pixel portions of the display section 111 to the horizontal part of the terminal section 112 is electrically connected to one of the protruding electrodes 113 while a control line drawn from each of the pixel portions of the display section 111 to the vertical part of the terminal section 112 is electrically connected to one of the protruding electrodes 114 and the protruding electrodes 115. The pixel portions of the display section 111 are driven by power and signals supplied from the external circuits 120 and 130.

<Manufacturing Method>

A method of manufacturing the display device 100 will be described below. In this method, the flexible printed boards 150 and 160 are mounted on the vertical part of the terminal section 112 and the external circuit 130.

<Arranging Step>

Figure 6:
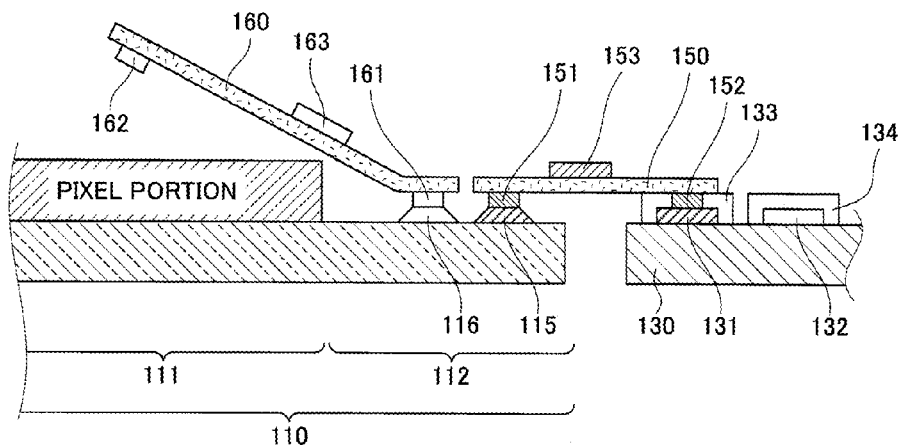
FIG. 6 illustrates an arranging step in a method of manufacturing the display device according to the embodiment.

In this manufacturing method, as illustrated in FIG. 6, the flexible printed board 150 is first disposed such that the output-side electrodes 151 are located on the terminal section 112 and the input-side electrodes 152 are located on the external circuit 130. The flexible printed board 160 is disposed such that the output-side electrodes 161 are located on the terminal section 112 and the input-side electrodes 162 are located on the display section 111. The position of the input-side connected portion of the flexible printed board 150 is adjusted so as to locate the input-side electrodes 152 on the metal electrodes 131. The position of the output-side connected portion of the flexible printed board 150 is adjusted so as to locate the output-side electrodes 151 on the protruding electrodes 115. The position of the input-side connected portion of the flexible printed board 160 is adjusted so as to locate the input-side electrodes 162 on the metal electrodes 132. The position of the output-side connected portion of the flexible printed board 160 is adjusted so as to locate the output-side electrodes 161 on the protruding electrodes 116.

The ACF 133 is disposed beforehand on the external circuit 130 so as to cover the metal electrodes 131. The ACF 133 is pressed to the external circuit 130 by a head 170, which is heated to 100° C. or lower, while preventing a reaction of epoxy resin in the ACF 133. Similarly, the ACF 134 is disposed beforehand on the external circuit 130 so as to cover the metal electrodes 132. The ACF 134 is pressed to the external circuit 130 by the head 170, which is heated to 100° C. or lower, while preventing a reaction of epoxy resin in the ACF 134.

<First Connecting Step>

Figure 7:
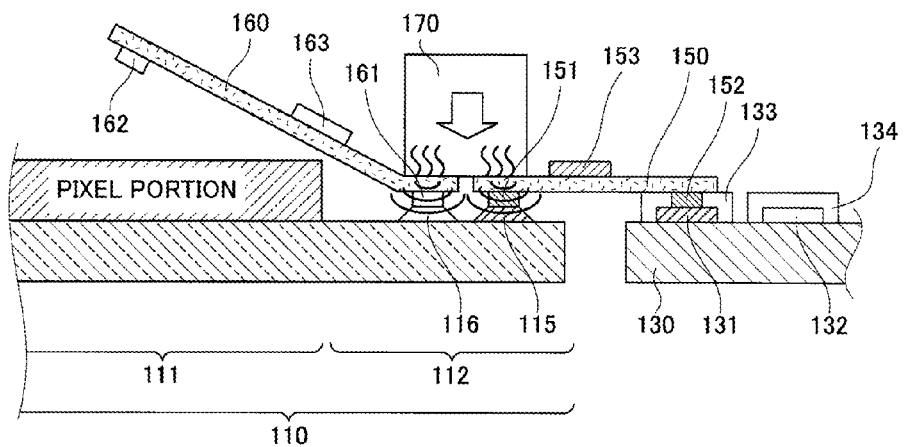
FIG. 7 illustrates a first connecting step in the method of manufacturing the display device according to the embodiment.

In the manufacturing method, as illustrated in FIG. 7, the output-side electrodes 151 of the flexible printed board 150 are then directly connected to the protruding electrodes 115 of the terminal section 112; meanwhile, the output-side electrodes 161 of the flexible printed board 160 are directly connected to the protruding electrodes 116 of the terminal section 112. At this point, the used head 170 can cover the output-side electrodes 151 and 161. The head 170 is disposed over the row of the protruding electrodes 115 and the row of the protruding electrodes 116. The output-side connected portion of the flexible printed board 150 and the output-side connected portion of the flexible printed board 160 are simultaneously pressed from above by the head 170 heated to 80° C. to 200° C. An ultrasonic wave with a frequency of 40 kHz to 130 kHz and an output of 2 W to 40 W is applied to the head 170 in a state in which the output-side electrodes 151 are in contact with the protruding electrodes 115 and the output-side electrodes 161 are in contact with the protruding electrodes 116.

Thus, oxide films on the surfaces of the output-side electrodes 151 and 162 and the protruding electrodes 115 and 116 are broken because of its temperature, an ultrasonic wave, and a load. Then, the newly formed surfaces of the output-side electrode 151 and the protruding electrode 115 are rubbed against each other to form the alloy layer on the contact portion between the output-side electrode 151 and the protruding electrode 115; meanwhile, the newly formed surfaces of the output-side electrode 161 and the protruding electrode 116 are rubbed against each other to form the alloy layer on the contact portion between the output-side electrode 161 and the protruding electrode 116. The output-side electrodes 151 are joined to the protruding electrodes 115 while the output-side electrodes 161 are joined to the protruding electrodes 116.

<Second Connecting Step>

Figure 8:
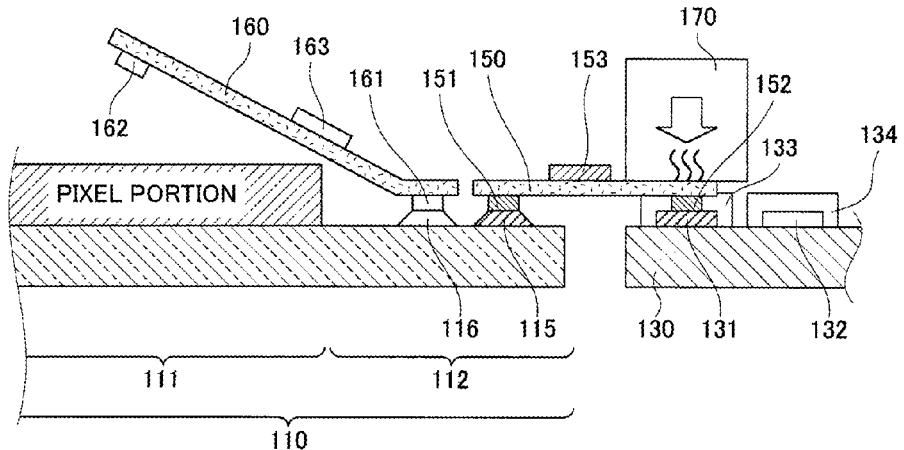
FIG. 8 illustrates a second connecting step in the method of manufacturing the display device according to the embodiment.

In the manufacturing method, as illustrated in FIG. 8, the input-side electrodes 152 of the flexible printed board 150 are then directly connected to the metal electrodes 131 of the external circuit 130. At this point, the input-side connected portion of the flexible printed board 150 is pressed from above by the head 170, which is heated to 160° C. to 250° C., with a pressure of 0.5 MPa to 2 MPa for five to ten seconds.

Hence, the epoxy resin in the ACF 133 is cured by heat in a state in which conductive particles in the ACF 133 are deformed between the metal electrodes. The conductive particles can be kept in the deformed state, enabling continuity between the input-side electrodes 152 and the metal electrodes 131.

<Folding Step>

Figure 9:
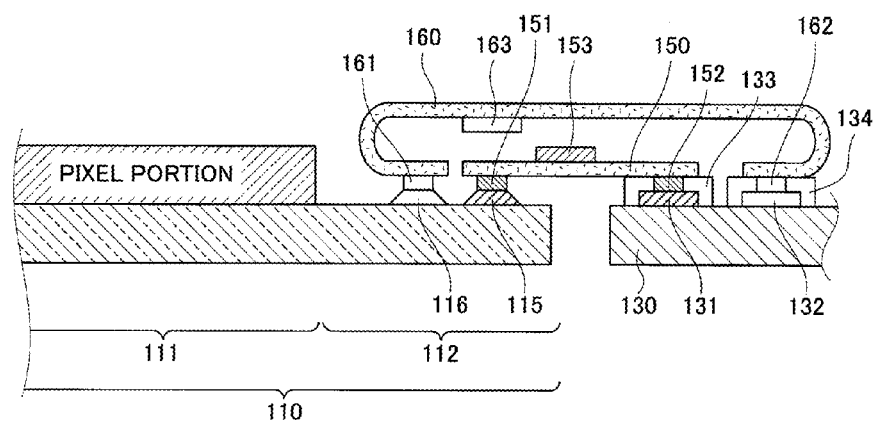
FIG. 9 illustrates a folding step in the method of manufacturing the display device according to the embodiment.

After that, in the manufacturing method, the flexible printed board 160 is folded as illustrated in FIG. 9. At this point, the output-side connected portion of the flexible printed board 163 is folded such that a semiconductor element 163 mounted on the flexible printed board 160 is located above a semiconductor element 153 mounted on the flexible printed board 150. The input-side connected portion of the flexible printed board 160 is folded again such that the input-side electrodes 162 of the flexible printed board 160 are opposed to the metal electrodes 132 of the external circuit 130. The flexible printed board 160 is brought closer to the flexible printed board 150 in a state in which the flexible printed board 160 is not in contact with the flexible printed board 150.

<Third Connecting Step>

Figure 10:
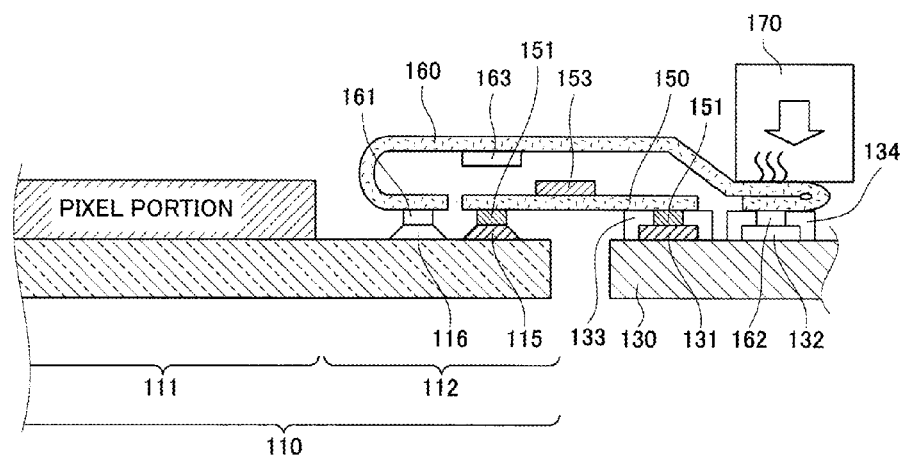
FIG. 10 illustrates a third connecting step in the method of manufacturing the display device according to the embodiment.

In the manufacturing method, as illustrated in FIG. 10, the input-side electrodes 162 of the flexible printed board 160 are then directly connected to the metal electrodes 132 of the external circuit 130. At this point, the input-side connected portion of the flexible printed board 160 is pressed from above by the head 170, which is heated to 160° C. to 250° C., with a pressure of 0.5 MPa to 2 MPa for five to ten seconds.

Hence, the epoxy resin in the ACF 134 is cured by heat in a state in which conductive particles in the ACF 134 are deformed between the metal electrodes. The conductive particles can be kept in the deformed state, enabling continuity between the input-side electrodes 162 and the metal electrodes 132.

Figure 11:
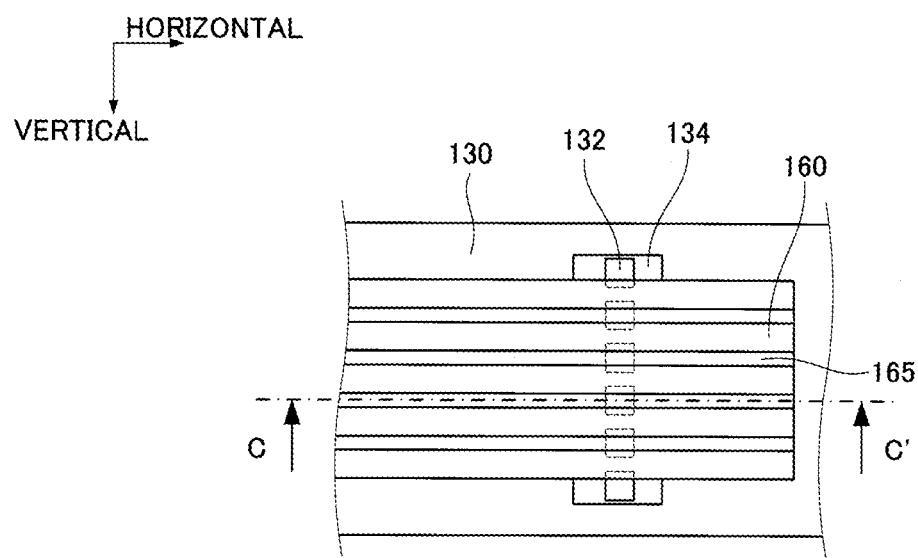
FIG. 11 illustrates the vicinity of the input-side connected portion of a flexible printed board according to the embodiment.
Figure 12:
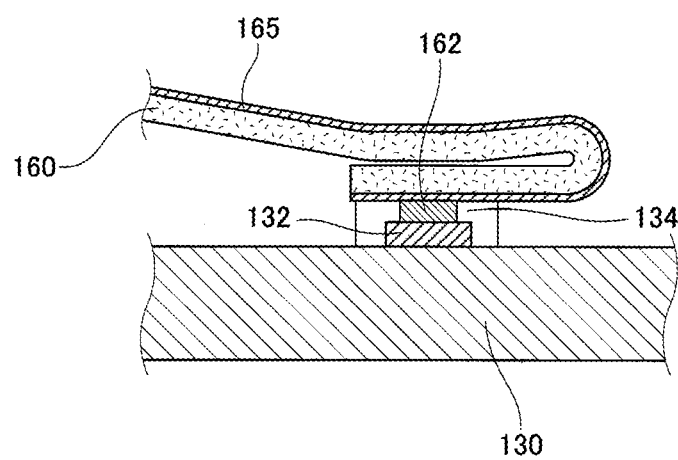
FIG. 12 is a cross-sectional view illustrating the vicinity of the input-side connected portion of the flexible printed board taken along the arrows C-C' according to the embodiment.

In the manufacturing method, when the input-side electrodes 162 are connected to the metal electrodes 132, the flexible printed board 160 is pressed in a folded state by the head 170. At this point, a load from the head 170 is easily released into the flexible printed board 160 and thus the load cannot be stably applied to contact portions between the input-side electrodes 162 and the metal electrodes 132, increasing the occurrence of faulty connections. To address this problem, as illustrated in FIG. 11, a plurality of wires 165 on the flexible printed board 160 are extended in parallel like straight lines along the longitudinal direction of the flexible printed board 160. As illustrated in FIG. 12, the flexible printed board 160 is folded such that the wires 165 of the flexible printed board 160 are folded above the row of the metal electrodes 132. Thus, in the third connecting step, the input-side electrodes 162 are disposed directly under the wires 165 of the flexible printed board 160, allowing a load from the head 170 to be evenly and stably applied to the input-side connected portion.

In the case where the flexible printed board 140 is mounted on the horizontal part of the terminal section 112 and the external circuit 120, the output-side electrodes 141 are connected to the protruding electrodes 113 in the following steps: first, the protruding electrodes 113 are covered with the ACF 114, and then the output-side electrodes 141 are placed on the protruding electrodes 113 covered with the ACF 114. The output-side connected portion is then heated and pressed in a state in which the output-side electrodes 141 are placed on the protruding electrodes 113. Thus, the output-side electrodes 141 are connected to the protruding electrodes 113. The input-side electrodes 142 are connected to the metal electrodes 121 in similar steps.

<Summary>

According to the present embodiment, the one end (output-side connected portion) of the flexible printed board 150 and the one end (output-side connected portion) of the flexible printed board 160 are opposed to each other. Thus, the flexible printed board 150 and the flexible printed board 160 can be connected to the vertical part (connecting surface) of the terminal section 112 in a single connecting step. Accordingly, even if the number of mounted flexible printed boards increases, an increase in production lead time can be avoided.

The protruding electrodes 115 and the protruding electrodes 116 are arranged in a staggered configuration. The row of the protruding electrodes 115 is adjacent to the row of the protruding electrodes 116. With this configuration, even if the number of mounted flexible printed boards increases, an increase in the frame width of the terminal section 112 can be avoided.

Specifically, the output-side connected portions of the flexible printed boards 150 and 160 are simultaneously connected to the terminal section 112 by the head 170 pressed over the protruding electrodes 115 and 116. At this point, the contact portion between the output-side electrode 151 and the protruding electrode 115 is subjected to heat, a pressure, and an ultrasonic wave to form the alloy layer; meanwhile, the contact portion between the output-side electrode 161 and the protruding electrode 116 is subjected to heat, a pressure, and an ultrasonic wave to form the alloy layer.

Hence, the conventional two steps of connection can be reduced to the single step, leading to a shorter production lead time. Moreover, without using the ACF, the output-side electrodes 151 can be directly connected to the protruding electrodes 115 and the output-side electrodes 161 can be directly connected to the protruding electrodes 116. This configuration can eliminate the need for considering an ACF flow when determining spacing between the protruding electrodes 115 and 116. Accordingly, the spacing between the protruding electrodes 115 and 116 can be set at a half of 1 mm or less, e.g., about 0 mm to 0.5 mm, thereby avoiding an increase in the frame width of the terminal section 112.

<Modification>

Figure 13:
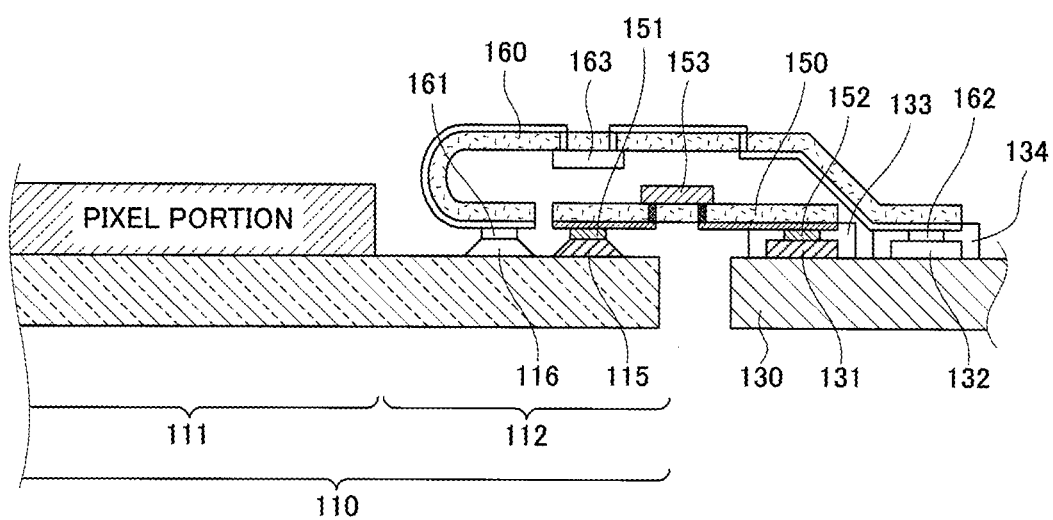
FIG. 13 is a cross-sectional view illustrating the vertical part of a terminal section according to a modification of the embodiment.
Figure 14A:
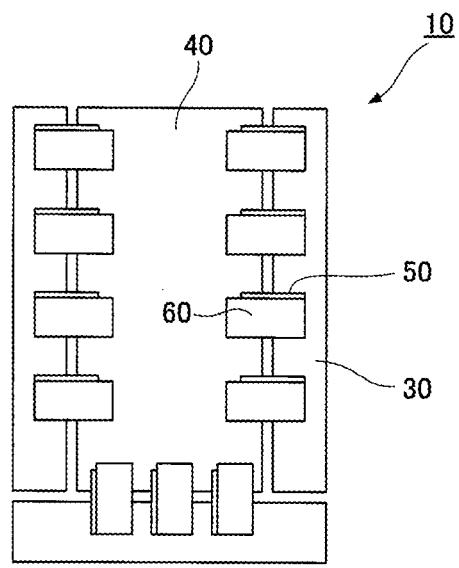
FIG. 14A is a first view illustrating a connecting method of a conventional flexible printed board.
Figure 14B:
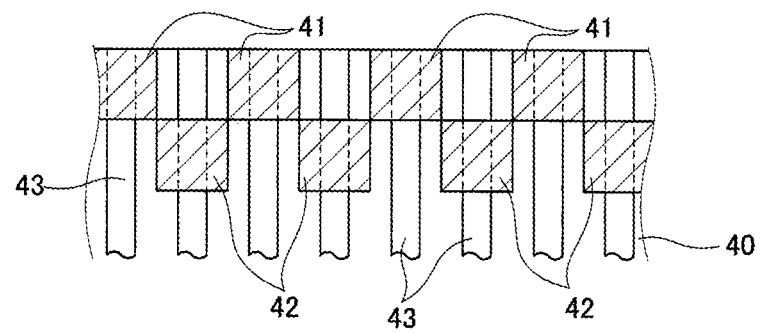
FIG. 14B is a second view illustrating the connecting method of the conventional flexible printed board.
Figure 14C:
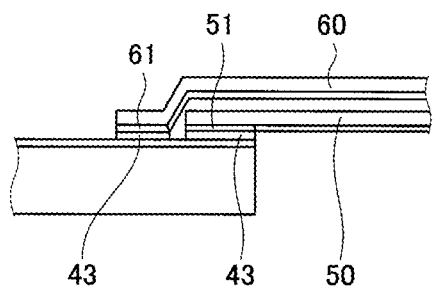
FIG. 14C is a third view illustrating the connecting method of the conventional flexible printed board.
Figure 15:
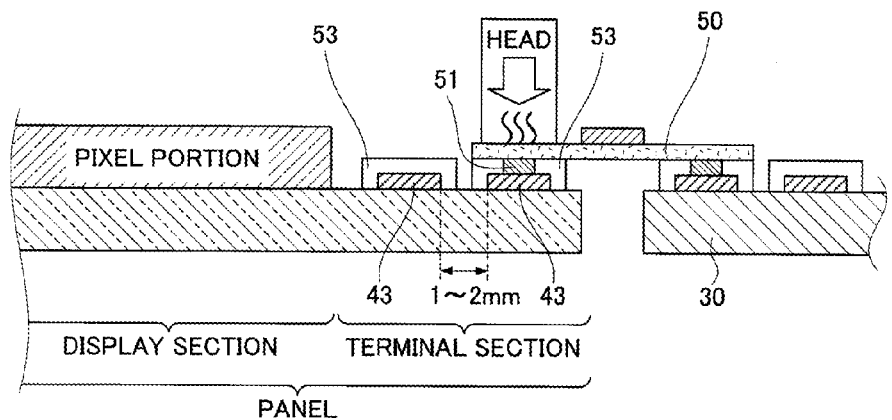
FIG. 15 illustrates a first connecting step of the conventional flexible printed board.
Figure 16:
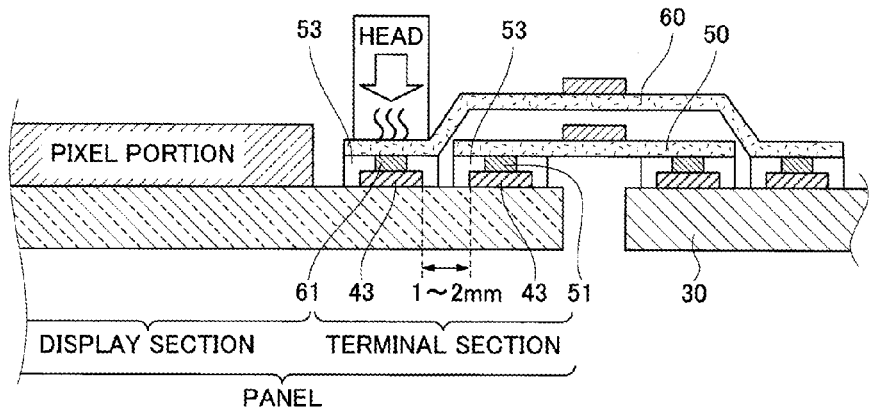
FIG. 16 illustrates a second connecting step of the conventional flexible printed board.

Unlike the structure of the flexible printed board 140, the flexible printed board 160 may have wires on two surfaces such that the wires on one of the surfaces are electrically connected to the wires on the other surface through vias. For example, as illustrated in FIG. 13, the input-side electrodes 162 are formed and the semiconductor element 163 is mounted on the opposite side from the output-side electrodes 161. In this case, the flexible printed board 160 is folded an odd number of times between the one end (output-side connected portion) and the other end (input-side connected portion) of the flexible printed board 160. Specifically, in the folding step, the input-side connected portion of the flexible printed board 160 is folded such that the semiconductor element 163 mounted on the flexible printed board 160 is located above the semiconductor element 153 mounted on the flexible printed board 150 and the input-side electrodes 162 of the flexible printed board 160 are opposed to the metal electrodes 132 of the external circuit 130.

Industrial Applicability

The present invention can be used as a display device, for example, a liquid crystal display device and an organic EL display device which can provide high-quality display with a smaller thickness and lower power consumption.

The invention claimed is:

1. A display device comprising a display section that displays an image and a terminal section that is formed around the display section,
wherein the display device further comprises a first flexible printed board and a second flexible printed board overlapping the first flexible printed board,
an external circuit that controls the display section is disposed next to a connecting surface of the terminal section with respect to the horizontal direction,
a row of first protruding electrodes and a row of second protruding electrodes are formed on the connecting surface of the terminal section,
the row of the second protruding electrodes is disposed between the row of the first protruding electrodes and the display section,
one end of the first flexible printed board is connected to the row of the first protruding electrodes,
one end of the second flexible printed board is connected to the row of the second protruding electrodes,
the row of the first protruding electrodes is adjacent to the row of the second protruding electrodes,
one end face of the first flexible printed board and one end face of the second flexible printed board are opposed to each other, and
the second flexible printed board is folded toward the external circuit above the terminal section so as not to block light to the display section.

2. The display device according to claim 1,
wherein a row of first metal electrodes and a row of second metal electrodes are formed on a connecting surface of the external circuit,
the row of the second metal electrodes is located farther from the terminal section than the row of the first metal electrodes,
another end of the first flexible printed board is connected to the row of the first metal electrodes,
another end of the second flexible printed board is connected to the row of the second metal electrodes.

3. The display device according to claim 2, further comprising:
a plurality of first electrodes formed on the one end of the second flexible printed board, the first electrode being connected to the second protruding electrode; and
a plurality of second electrodes formed on the other end of the second flexible printed board, the second electrode being connected to the second metal electrode,
wherein the plurality of first electrodes and the plurality of second electrodes are disposed on one surface of the second flexible printed board, and
the second flexible printed board is folded an even number of times between the one end and the other end of the second flexible printed board.

4. The display device according to claim 3, wherein the second flexible printed board is folded such that wires of the second flexible printed board are folded above the row of the second metal electrodes.

5. The display device according to claim 2, further comprising:
a plurality of first electrodes formed on the one end of the second flexible printed board, the first electrode being connected to the second protruding electrode; and
a plurality of second electrodes formed on the other end of the second flexible printed board, the second electrode being connected to the second metal electrode,
wherein the plurality of first electrodes are disposed on one of two surfaces of the second flexible printed board,
the plurality of second electrodes are disposed on the other surface of the second flexible printed board, and
the second flexible printed board is folded an odd number of times between the one end and the other end of the second flexible printed board.

6. The display device according to claim 1, the one end face of the first flexible printed board and the one end face of the second flexible printed board are immediately and directly opposed to each other.

7. A method of manufacturing a display device comprising a display section that displays an image and a terminal section that is formed around the display section,
wherein a row of first protruding electrodes and a row of second protruding electrodes are formed on a connecting surface of the terminal section, the row of the second protruding electrodes is disposed between the row of the first protruding electrodes and the display section, and the row of the first protruding electrodes is adjacent to the row of the second protruding electrodes,
the method comprising:
disposing one end of a first flexible printed board above the row of the first protruding electrodes and disposing one end of a second flexible printed board above the row of the second protruding electrodes in a state in which one end face of the first flexible printed board and one end face of the second flexible printed board are opposed to each other,
simultaneously pressing the one end of the first flexible printed board and the one end of the second flexible printed board by a head to connect the one end of the first flexible printed board to the row of the first protruding electrodes and the one end of the second flexible printed board to the row of the second protruding electrodes, and
folding the second flexible printed board above the terminal section so as not to block light to the display section in a state in which the one end of the second flexible printed board is connected to the row of the second protruding electrodes.

8. The method of manufacturing a display device according to claim 7, the one end face of the first flexible printed board and the one end face of the second flexible printed board are immediately and directly opposed to each other.

* * * * *